(12) United States Patent
Em et al.

(10) Patent No.: US 8,369,138 B2
(45) Date of Patent: Feb. 5, 2013

(54) SEMICONDUCTOR MEMORY DEVICE FOR READING OUT DATA STORED IN MEMORY

(75) Inventors: Ho Seok Em, Icheon (KR); Taek Seung Kim, Cheongju (KR)

(73) Assignee: Hynix Semiconductor Inc., Icheon (KR)

( * ) Notice: Subject to any disclaimer, the term of this patent is extended or adjusted under 35 U.S.C. 154(b) by 226 days.

(21) Appl. No.: 12/828,090

(22) Filed: Jun. 30, 2010

(65) Prior Publication Data
US 2011/0157968 A1    Jun. 30, 2011

(30) Foreign Application Priority Data
Dec. 30, 2009 (KR) .......................... 10-2009-0134192

(51) Int. Cl.
*G11C 11/00* (2006.01)
*G11C 8/08* (2006.01)
(52) U.S. Cl. .... 365/163; 365/148; 365/194; 365/230.06
(58) Field of Classification Search ................. 365/163, 365/148, 201, 230.06
See application file for complete search history.

(56) References Cited

U.S. PATENT DOCUMENTS

| | | | | |
|---|---|---|---|---|
| 2008/0062741 A1* | 3/2008 | Choi et al. | ..................... | 365/148 |
| 2009/0231901 A1* | 9/2009 | Kim | .............................. | 365/96 |
| 2009/0323408 A1* | 12/2009 | Taylor et al. | .................. | 365/163 |
| 2010/0142245 A1* | 6/2010 | Kitagawa | ........................ | 365/51 |

FOREIGN PATENT DOCUMENTS

KR    1020080023582 A    3/2008

* cited by examiner

*Primary Examiner* — Huan Hoang
*Assistant Examiner* — Tri Hoang (57) ABSTRACT

A semiconductor memory device measures a leakage current generated when a unit cell is accessed during a test process. The semiconductor memory device includes a unit cell configured to include a memory element, a word line configured to be coupled to one end of the unit cell, and a bit line configured to be coupled to the other end of the unit cell. In a normal operation, a current signal flows from the bit line to the word line through the unit cell such that data stored in the memory element is read. In a test operation, the word line is deactivated and a read operation is carried out such that data stored in the memory element is read.

18 Claims, 8 Drawing Sheets

SEMICONDUCTOR MEMORY DEVICE FOR READING OUT DATA STORED IN MEMORY

CROSS-REFERENCE TO RELATED APPLICATION

The priority of Korean patent application No. 10-2009-0134192 filed on 30 Dec. 2009, the disclosure of which is hereby incorporated in its entirety by reference, is claimed.

BACKGROUND OF THE INVENTION

Embodiments of the present invention relate to a semiconductor memory device.

Semiconductor memory devices have been rapidly developed to temporarily or permanently store data therein. The semiconductor memory devices have been widely used in a variety of electronic appliances, electronic devices, and personal portable devices. General semiconductor memory devices can freely read and/or write data, and also easily update old data to new data.

The semiconductor memory device has been developed such that it can store an increasing amount of data therein, operate with a small amount of power, and increase or expedite an operating speed. Although a NOR flash memory device or a NAND flash memory device has been widely used as a non-volatile memory, a conventional flash memory device has a disadvantage that it has a slow operating speed.

In order to overcome the above-mentioned disadvantage, a phase change random access memory (PCRAM) has been developed. The PCRAM changes a resistance value of a material contained in a unit cell to another resistance value using a current signal, stores data corresponding to the changed resistance value, and reads a difference in current between two resistance values. The PCRAM includes a material which causes a temperature-based phase change in a unit cell, and a crystal structure of the material changes to a crystalline state or non-crystalline state (also called an amorphous state) according to a temperature generated by an amount of a current flowing through the material. For example, the material may use germanium antimony tellurium (Ge2Sb2Te5, GST) whose resistance value is changed according to a crystalline or amorphous state.

BRIEF SUMMARY OF THE INVENTION

Various embodiments of the present invention are directed to providing a semiconductor memory device that substantially obviates one or more problems due to limitations and disadvantages of the related art.

An embodiment of the present invention relates to a semiconductor memory device for measuring a leakage current generated when accessing a unit-cell in a test operation, thereby substantially preventing a faulty operation or malfunction from being caused in read and write operations, and enhancing the reliability of the operation.

An embodiment of the present invention relates to a semiconductor memory device which deactivates a word line at the same time of performing a read operation in a test operation to read out data stored in unit cells.

In accordance with one aspect of the present invention, there is provided a semiconductor memory device including a unit cell configured to include a memory element, a word line configured to be coupled to one end of the unit cell, and a bit line configured to be coupled to the other end of the unit cell, wherein, in a normal operation, a current signal flows from the bit line to the word line through the unit cell such that data stored in the memory element is read, and in a test operation, the word line is deactivated and a read operation is carried out such that data stored in the memory element is read.

If the data is set to '1', generation of a leakage current in the unit cell may be recognized.

The semiconductor memory device may further include a control signal generator configured to output an enable signal in response to a read command and an address from an external part, a delay unit configured to delay the enable signal, a word line driving controller configured to determine whether the word line is activated or deactivated in response to the enable signal and an output signal of the delay unit, and a word line driving unit configured to output the word line and an access signal in response to an output signal of the word line driving controller.

The word line and the access signal may be activated in response to a row address of the unit cell.

The word line driving unit may deactivate both the word line and the access signal when the test signal is activated.

The word line driving controller may include an OFF signal generator configured to generate a word line OFF signal which is activated in response to the output signal of the delay unit and is deactivated in response to the enable signal, and a test mode inspection unit configured to transmit the word line OFF signal and the enable signal when the test signal is deactivated, and deactivate all output signals when the test signal is activated.

The word line driving unit may include an input end configured to transmit a ground voltage or a high voltage in response to the output signal of the word line driving controller, an inverter latch configured to temporarily store and invert a voltage transferred from the input end, and output the access signal; and a driving unit configured to invert the access signal, and output the inverted access signal.

The unit cell may include a variable resistor having a resistance value changeable with the stored data, and read the data on the basis of a difference in an amount of current in response to the resistance value.

In accordance with another aspect of the present invention, there is provided a phase change semiconductor memory device including a unit cell configured to include a phase change memory element, a word line configured to be coupled to one end of the unit cell, and a bit line configured to be coupled to the other end of the unit cell, wherein, in a normal operation, a current signal flows from the bit line to the word line through the unit cell such that a resistance status of the phase change memory element is read, and in a test operation, the word line is deactivated and a read operation is carried out such that a resistance status of the phase change memory element is read.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Embodiments of the present invention provide a design technology for allowing a test operation to examine whether a leakage current is generated in a row access circuit and a unit cell during a read or write operation of a semiconductor memory device.

For example, in a semiconductor memory device detecting a value of stored data based on an amount of current flowing in a unit cell, and storing different data in response to an amount of current flowing through the unit cell, if an undesired leakage current is generated in the unit cell, the operational stability of the semiconductor memory device is decreased.

An embodiment of the present invention mandatorily deactivates a word line to be activated in a test operation, detects an amount of current flowing in a unit cell, and recognizes the presence or absence of a leakage current based on the detected result.

Figure 1A:
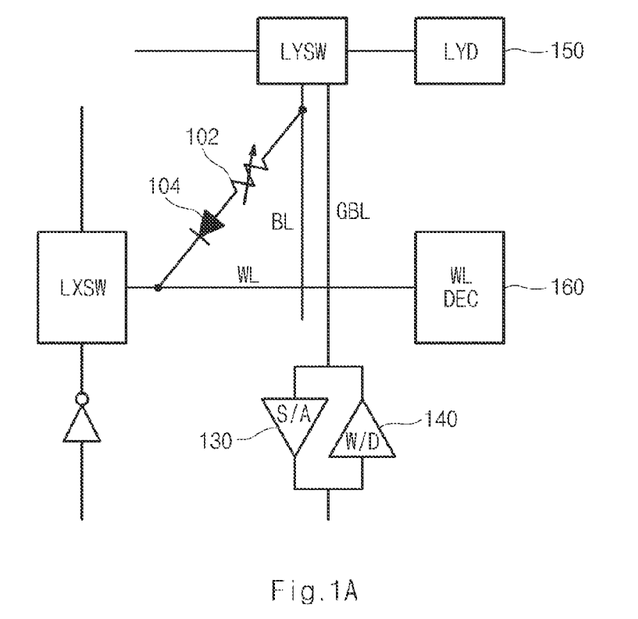
FIGS. 1A and 1B illustrate block diagrams of a semiconductor memory device according to first and second embodiments of the present invention, respectively.
Figure 1B:
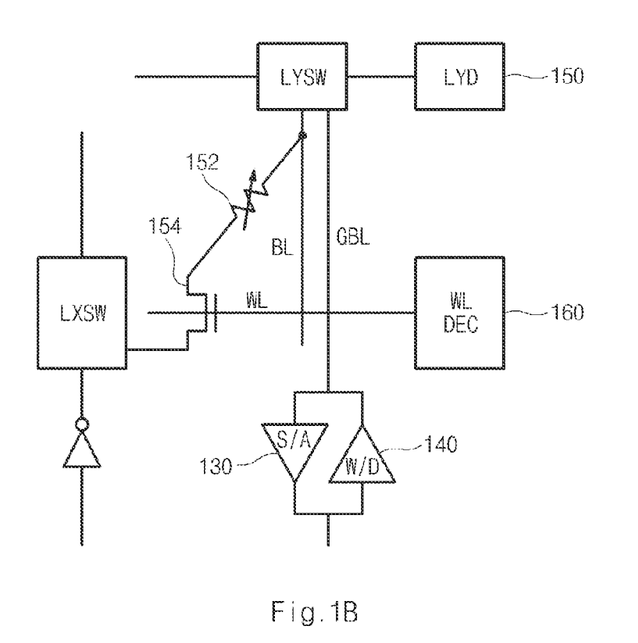

FIGS. 1A and 1B respectively illustrate block diagrams of a semiconductor memory device according to first and second embodiments of the present invention.

FIG. 1A illustrates a case in which a current signal flows in a unit cell when a word line WL of the semiconductor memory device is at a logic low level. The unit cell includes a phase change memory element 102, resistance of which is changed with the current signal, and a diode 104 coupled to the phase change memory element 102.

The phase change memory element 102 is coupled to a bit line BL, and is coupled to a global bit line GBL through a bit line switch LYSW controlled by a bit line driver (not shown).

In the meantime, the diode 104 is coupled to the word line WL, and the word line WL controlled by a word line decoder (WL DEC) 160 is coupled to a word line switch LXSW. The global bit line GBL is coupled to a sense-amplifier (S/A) 130 and a write driver (W/D) 140. The bit line switch LYSW is controlled by a column access circuit (LYD) 150, and the word line WL is controlled by a row access circuit, i.e., the word line decoder 160.

Meanwhile, FIG. 1B shows a circuit in which a current signal flows in a unit cell when a word line WL of the semiconductor memory device is at a logic high level according to the second embodiment of the present invention. Differently from the first embodiment of the present invention, the unit cell according to the second embodiment of the present invention includes a transistor 154 turned on or off by the word line WL, instead of the diode 104 in FIG. 1A, and the remaining components other than the transistor 154 may be the same as in FIG. 1A.

Source and drain terminals of the transistor 154 are coupled to a phase change memory element 152 and a word line switch LXSW, respectively, and a gate terminal is coupled to the word line WL.

Figure 2:
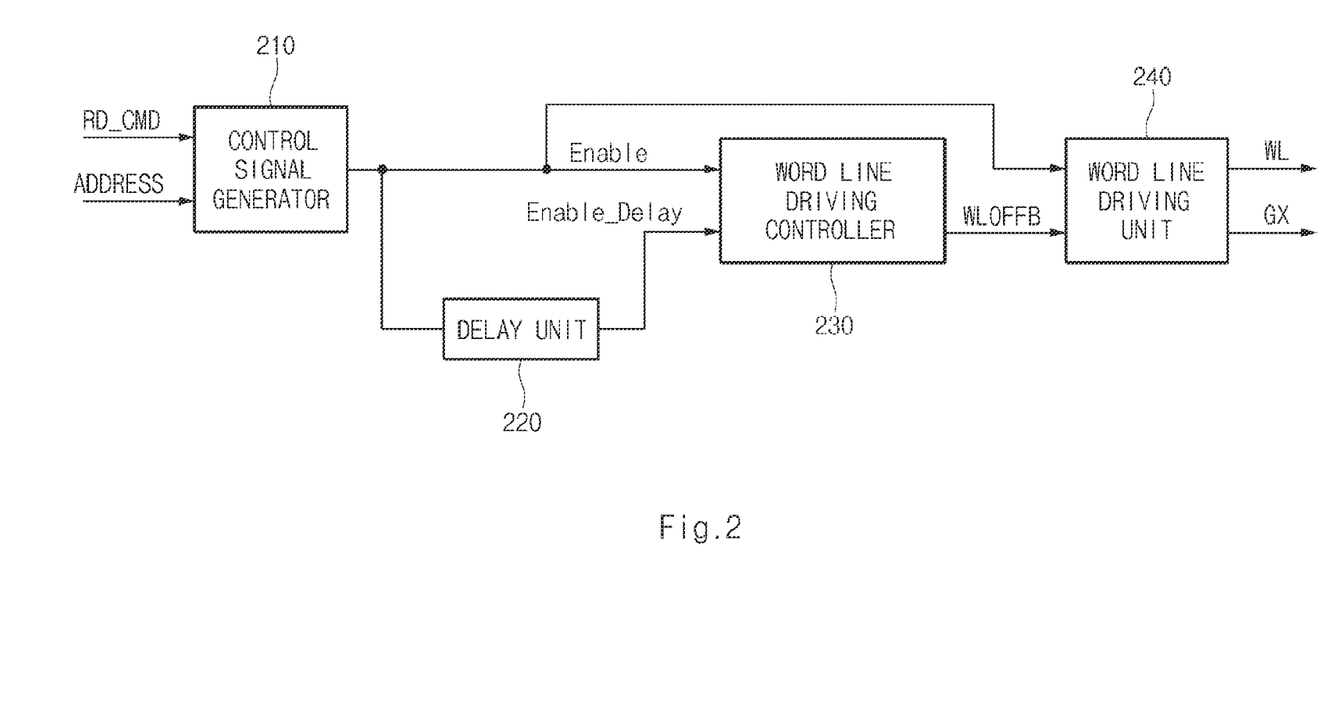
FIG. 2 is a block diagram illustrating a row access circuit shown in FIG. 1A or 1B according to an embodiment of the present invention.

FIG. 2 is a block diagram illustrating the row access circuit 160 shown in FIG. 1A or 1B according to an embodiment of the present invention.

Referring to FIG. 2, the row access circuit 160 includes a control signal generator 210, a delay unit 220, a word line driving controller 230, and a word line driving unit 240. The control signal generator 210 receives a read command RD_CMD and an address ADDRESS as input signals, decodes the read command RD_CMD and the address ADDRESS, and outputs an enable signal Enable. The delay unit 220 delays the enable signal Enable to output a delayed enable signal Enable_Delay. The word line driving controller 230 receives the enable signal Enable and the delayed enable signal Enable_Delay as input signals, and outputs a word line off signal WLOFFB. The word line driving unit 240 outputs an access signal GX for activating the word line WL and the word line switch LXSW in response to the enable signal Enable and the word line off signal WLOFFB.

Figure 3:
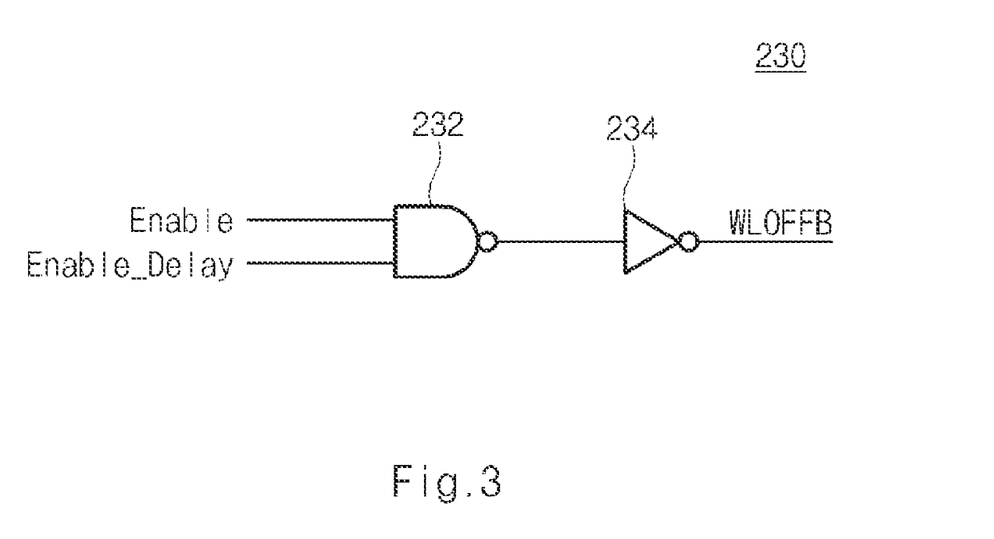
FIG. 3 is a circuit diagram illustrating a word line driving controller shown in FIG. 2 according to an embodiment of the present invention.

FIG. 3 is a circuit diagram illustrating the word line driving controller 230 shown in FIG. 2 according to an embodiment of the present invention.

Referring to FIG. 3, the word line driving controller 230 includes a first logic gate 232 and a second logic gate 234. The first logic gate receives the enable signal Enable and the delayed enable signal Enable_Delay as input signals, performs a logic NAND operation on the enable signal Enable and the delayed enable signal Enable_Delay, and outputs the logic NAND operation result. The second logic gate 234 may include an inverter for inverting an output signal of the first logic gate 232, and thus outputs the word line off signal WLOFFB. The word line driving controller 230 is designed to perform a logic AND operation on the enable signal Enable and the delayed enable signal Enable_Delay.

As a result, the word line off signal WLOFFB is disabled with a delayed time corresponding to a time delay of the delay unit 220 compared to the enable signal Enable, and the word line off signal WLOFFB is enabled as soon as the enable signal Enable is disabled.

Figure 4A:
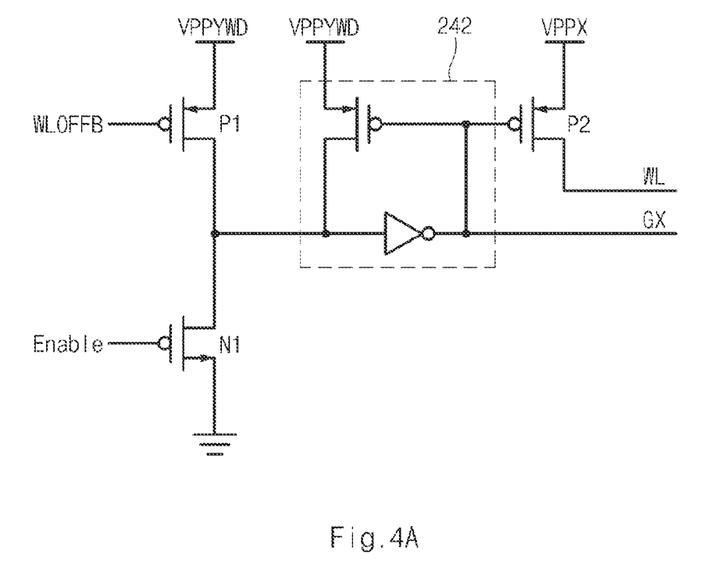
FIGS. 4A and 4B respectively illustrate a circuit diagram and a waveform diagram of a word line driving unit shown in FIG. 2 according to an embodiment of the present invention.
Figure 4B:
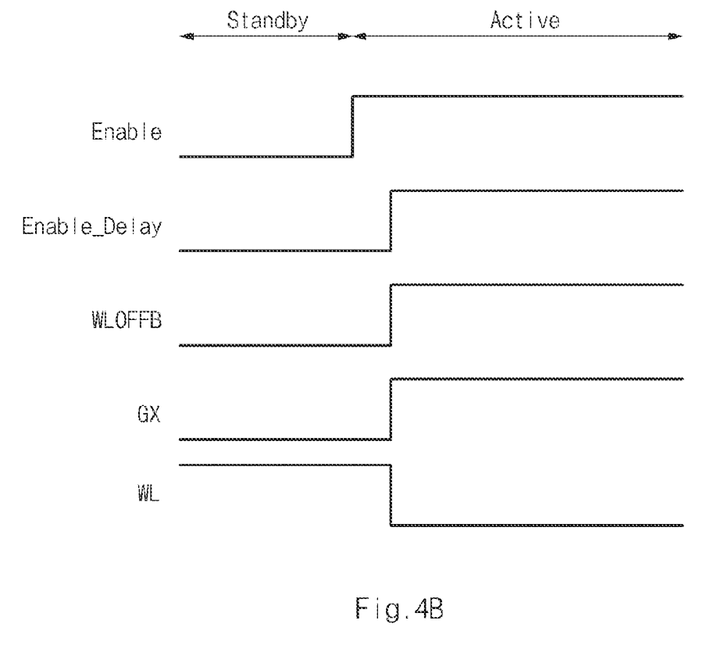

FIGS. 4A and 4B respectively illustrate a circuit diagram and a waveform diagram of the word line driving unit 240 shown in FIG. 2 according to an embodiment of the present invention.

Referring to FIG. 4A, the word line driving unit 240 includes a first driver P1, a second driver N1, an inverter latch 242, and a third driver P2. The first driver P1 outputs a high voltage VPPYWD to the inverter latch 242 when the word line off signal WLOFFB is enabled to a logic low level. If the enable signal Enable is enabled to a logic high level, the second driver N1 outputs a ground voltage to the inverter latch 242. The inverter latch 242 maintains both the word line WL and the access signal GX in a deactivated state when the word line off signal WLOFFB is enabled. The third driver P2 activates the word line WL in response to the access signal GX.

A row access operation of the semiconductor memory device will be described with reference to FIG. 4B.

Referring to FIG. 4B, the control signal generator 210 receives the read command RD_CMD and the address ADDRESS as input signals, decodes the read command RD_CMD and the address ADDRESS, and enables the enable signal Enable to a logic high level.

The delay unit 220 allows the enable signal Enable to be delayed as long as a predetermined time delay.

The word line driving controller 230 receives the enable signal Enable and the delayed enable signal Enable_Delay as input signals, and disables the word line off signal WLOFFB to a logic high level when the delayed enable signal Enable_Delay is enabled. If the word line off signal WLOFFB is disabled to the logic high level, the access signal GX is enabled to a logic high level and the word line WL is enabled to a logic low level. The word line WL enabled to the logic low level is able to access the unit cell described in FIG. 1A. On the other hand, in a standby state in which the enable signal Enable is disabled to a logic low level, the word line WL is disabled to a logic high level.

Figure 5:
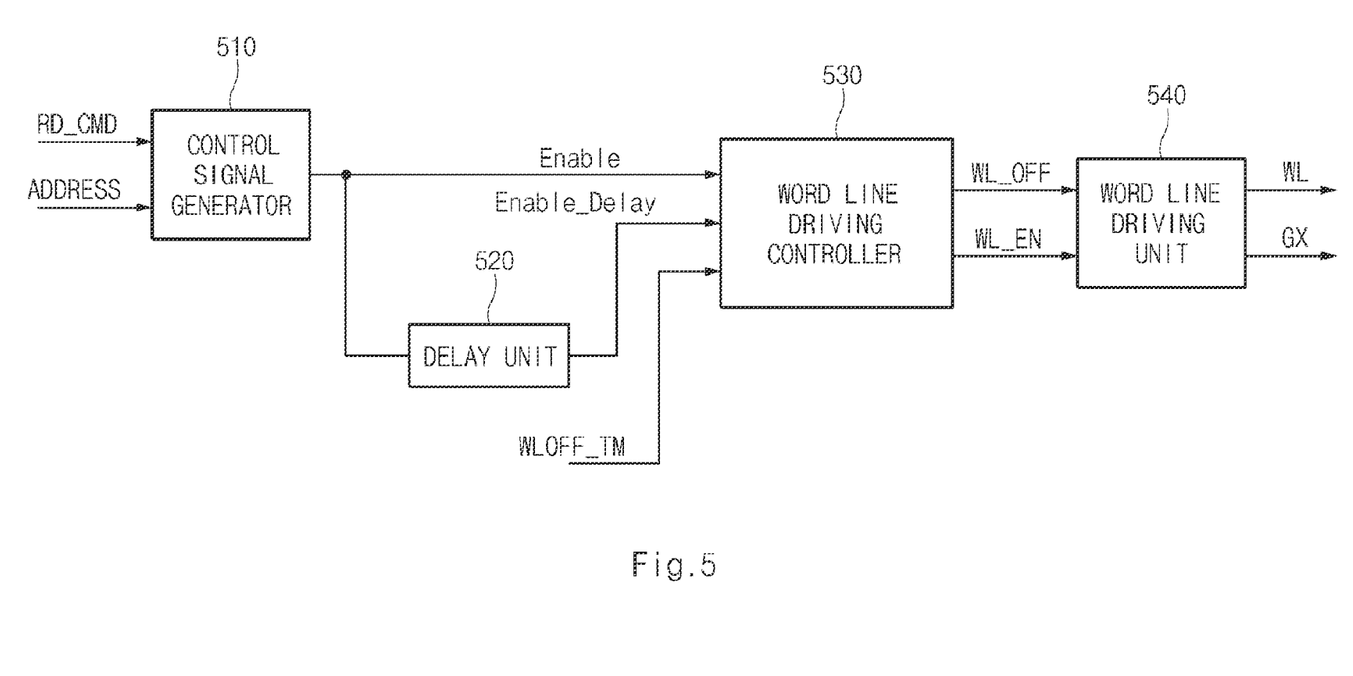
FIG. 5 is a block diagram illustrating a row access circuit shown in FIG. 1A or 1B according to another embodiment of the present invention.

FIG. 5 is a block diagram illustrating a row access circuit shown in FIG. 1A or 1B according to another embodiment of the present invention.

Referring to FIG. 5, the row access circuit includes a control signal generator 510, a delay unit 520, a word line driving controller 530, and a word line driving unit 540. The control signal generator 510 receives a read command RD_CMD and an address ADDRESS as input signals, decodes the read command RD_CMD and the address ADDRESS, and outputs an enable signal Enable. The delay unit 520 delays the enable signal Enable. The word line driving controller 530 receives the enable signal Enable and the delayed enable signal Enable_Delay as input signals, outputs a word line deactivation signal WL_OFF and a word line enable signal WL_EN. Also, the word line driving controller 530 deactivates the word line WL and an access signal GX in response to a test signal WLOFF_TM. The word line driving unit 540 outputs the access signal GX for activating the word line WL and the word line switch LXSW in response to the word line deactivation signal WL_OFF and the word line enable signal WL_EN.

Figure 6:
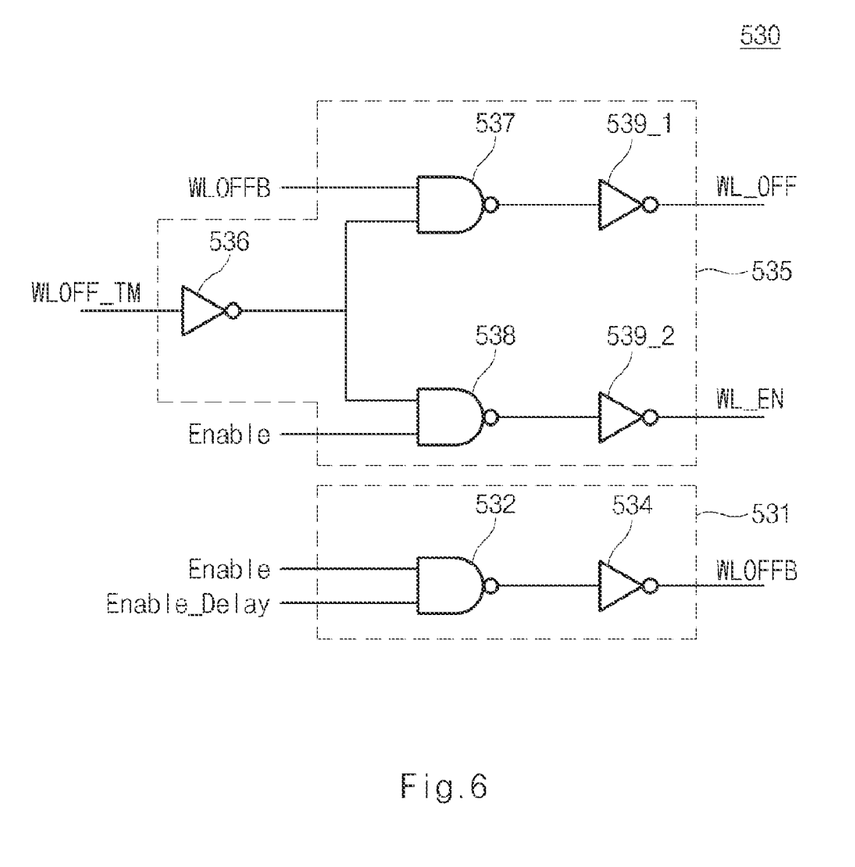
FIG. 6 is a circuit diagram illustrating a word line driving controller shown in FIG. 5 according to an embodiment of the present invention.

FIG. 6 is a circuit diagram illustrating the word line driving controller 530 shown in FIG. 5 according to an embodiment of the present invention.

Referring to FIG. 6, the word line driving controller 530 includes an off-signal generator 531 and a test-mode inspection unit 535.

The off-signal generator 531 includes a first logic gate 532 and a second logic gate 534. The first logic gate 532 receives the enable signal Enable and the delayed enable signal Enable_Delay as input signals, performs a logic NAND operation on the enable signal Enable and the delayed enable signal Enable_Delay, and outputs the logic NAND operation result. The second logic gate 534 may include an inverter for inverting an output signal of the first logic gate 532, and outputs the word line off signal WLOFFB. The off-signal generator 531 is designed to perform a logic AND operation on the enable signal Enable and the delayed enable signal Enable_Delay in the same manner as in the conventional word line controller 230. As a result, the word line off signal WLOFFB is disabled with a delayed time corresponding to a time delay of the delay unit 520 compared to the enable signal Enable, and the word line off signal WLOFFB is enabled as soon as the enable signal Enable is disabled.

The test mode inspection unit 535 deactivates the word line WL and the access signal GX when the test signal WLOFF_TM is enabled. If the test signal WLOFF_TM is disabled, the test mode inspection unit 535 activates the word line WL and the access signal GX in response to the enable signal Enable from the control signal generator 510. The test mode inspection unit 535 includes a third logic gate 536, fourth and fifth logic gates 537 and 538, and sixth and seventh logic gates 539_1 and 539_2. The third logic gate 536 inverts the test signal WLOFF_TM. The fourth logic gate 537 receives an output signal of the third logic gate 536 and the word line off signal WLOFFB, and performs a logic NAND operation on the output signal of the third logic gate 536 and the word line off signal WLOFFB. The fifth logic gate 538 receives the output signal of the third logic gate 536 and the enable signal Enable, and performs a logic NAND operation on the output signal of the third logic gate 536 and the enable signal Enable. The sixth logic gate 539_1 inverts an output signal of the fourth logic gate 537, and outputs the word line deactivation signal WL_OFF. The seventh logic gate 539_2 inverts an output signal of the fifth logic gate 538, and outputs the word line enable signal WL_EN.

Figure 7A:
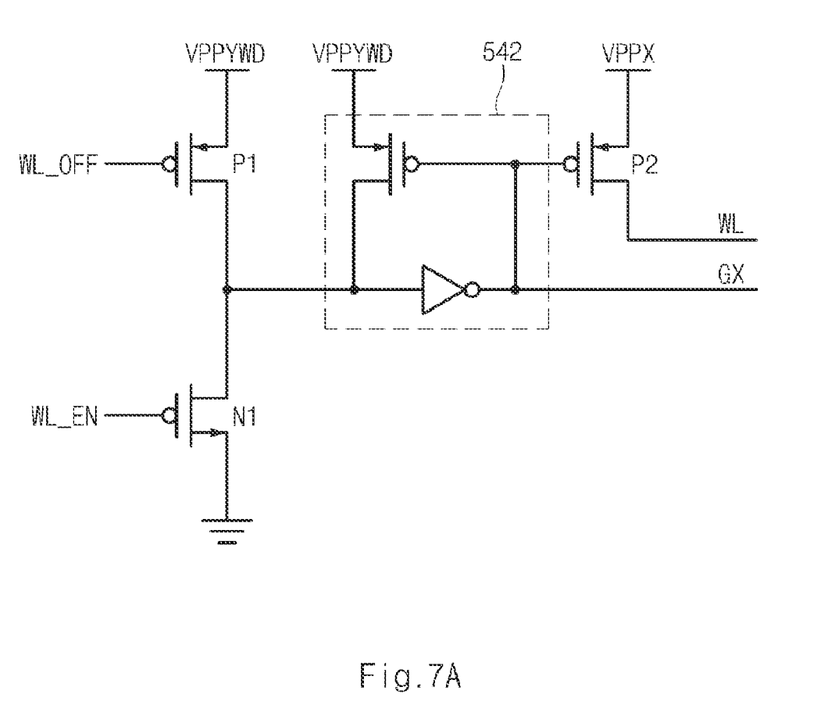
FIGS. 7A and 7B respectively illustrate a circuit diagram and a waveform diagram of a word line driving unit shown in FIG. 5 according to an embodiment of the present invention.
Figure 7B:
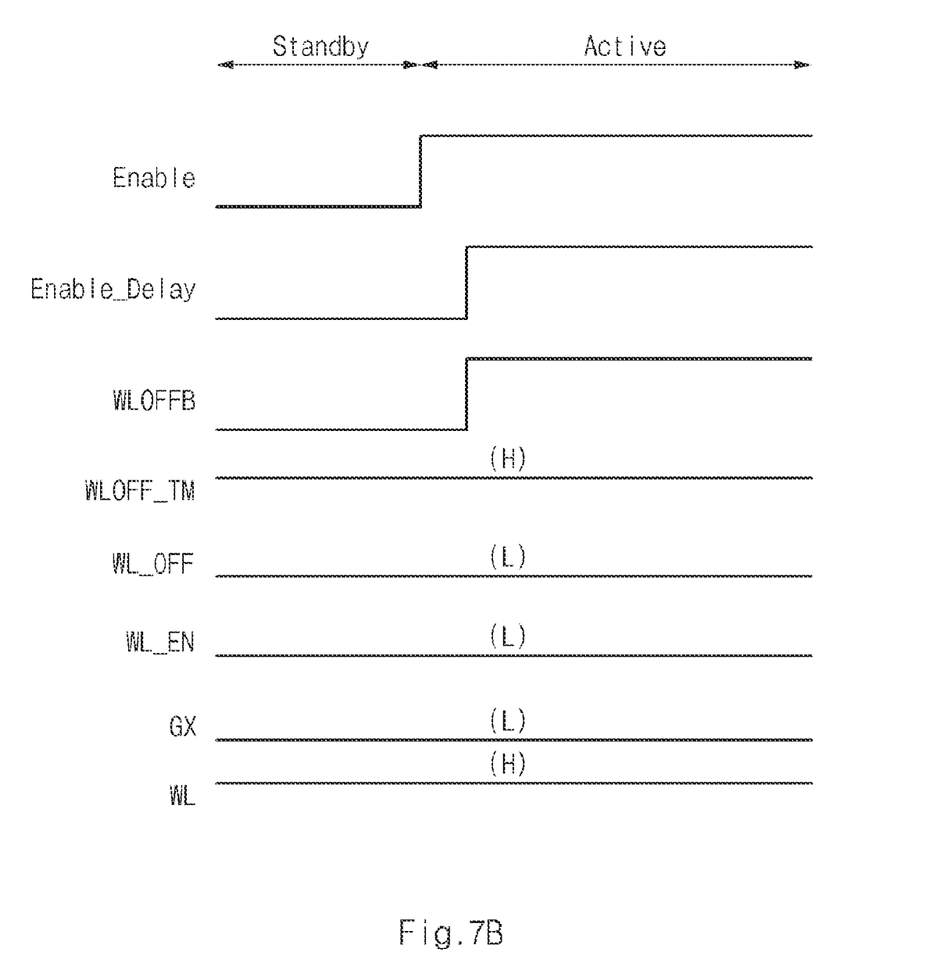

FIGS. 7A and 7B respectively illustrate a circuit diagram and a waveform diagram of the word line driving unit 540 shown in FIG. 5 according to an embodiment of the present invention.

Referring to FIG. 7A, the word line driving unit 540 includes a first driver P1, a second driver N1, an inverter latch 542, and a third driver P2. The first driver P1 outputs a high voltage VPPYWD to the inverter latch 542 when the word line deactivation signal WL_OFF is enabled to a logic low level. If the word line enable signal WL_EN is enabled to a logic high level, the second driver N1 outputs a ground voltage to the inverter latch 542. The inverter latch 542 maintains both the word line WL and the access signal GX in a deactivated state when the word line deactivation signal WL_OFF is enabled. The third driver P2 activates the word line WL in response to the access signal GX.

The row access operation of the semiconductor memory device, e.g., PCRAM, will be described with reference to FIG. 7B.

Referring to FIG. 7B, in a normal operation instead of the test operation, the control signal generator 510 receives the read command RD_CMD and the address ADDRESS from an external part, decodes the read command RD_CMD and the address ADDRESS, and thus activates the enable signal Enable to a logic high level. The delay unit 520 delays the enable signal Enable by a predetermined time delay. The word line driving controller 530 receives the enable signal Enable and the delayed enable signal Enable_Delay as input signals, such that it disables the word line deactivation signal WL_OFF to a logic high level when the delayed enable signal Enable_Delay is enabled. If the word line deactivation signal WL_OFF is disabled to the logic high level, the access signal GX generated from the word line driving unit 540 is enabled to a logic high level, and the word line WL is activated to a logic low level. The word line WL activated to the logic low level is able to access the unit cell described in FIG. 1A. On the other hand, in a standby state in which the word line enable signal WL_EN generated from the word line driving controller 530 is enabled to a logic low level, the word line WL generated from the word line driving unit 540 is deactivated to a logic high level.

In the meantime, in a test mode, the test signal WLOFF_TM applied to the word line driving controller 530 is enabled to a logic high level. If the test signal WLOFF_TM is enabled, the word line driving controller 530 disables both the word line deactivation signal WL_OFF and the word line enable signal WL_EN to a logic low level, irrespective of the activation or deactivation of the enable signal Enable and the delayed enable signal Enable_Delay. If the word line deactivation signal WL_OFF and the word line enable signal WL_EN are disabled, the access signal GX generated from the word line driving unit 540 is disabled to a logic low level and the word line WL is deactivated to a logic high level.

As described above, during the test mode, the row access operation is carried out in such a manner that the external read command RD_CMD is input and data is sensed and amplified in a unit cell, but the word line WL will be deactivated. In this case, provided that no leakage current is generated in the unit cell, no current flows in the unit cell, such that data detected by the read command becomes data of a logic high level ('1') because a resistance value of a variable resistor contained in the unit cell has a high level. However, if a leakage current is generated in the unit cell, the current flowing in the unit cell goes high, such that data detected by the read command becomes data of a logic low level ('0'). In other words, if the logic low level ('0') is output when the word line WL is deactivated, this means the leakage current is generated.

As described above, in accordance with the embodiments of the present invention, if the test signal is input to the row access circuit of the semiconductor memory device, and thus mandatorily deactivates the word line that must be activated by the external read command, data of the unit cell can be read out. As a result, the semiconductor memory device according to the embodiments of the present invention can easily recognize whether a leakage current is generated in the row access circuit and the unit cell, such that a faulty operation of the semiconductor memory device and a cause of the faulty operation can be more accurately recognized.

As apparent from the above description, the semiconductor memory device according to the embodiments of the present invention can easily recognize the presence or absence of the leakage current in the row access circuit and the unit cell by employing the circuit that inputs the test signal to the row access circuit to mandatorily deactivate the word line that must be activated in response to the external input command, and reads out the data of the unit cell.

In addition, the semiconductor memory device according to the embodiments of the present invention can recognize the presence or absence of the leakage current in the row access circuit and the unit cell during the test operation, such that a defect of the semiconductor memory device or a cause of the faulty operation can be more accurately recognized.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor memory device comprising:
a unit cell including a memory element;
a word line coupled to a first end of the unit cell;
a bit line coupled to a second end of the unit cell;
a control signal generator configured to output an enable signal in response to a read command and an address signal received from an external node;
a delay unit configured to delay the enable signal;
a word line driving controller configured to determine whether the word line is activated or deactivated in response to the enable signal, an output signal of the delay unit, and a test signal; and
a word line driving unit configured to drive the word line and output an access signal in response to an output signal of the word line driving controller,
wherein, in a normal mode, data stored in the memory element is read out as a current signal flowing from the bit line to the word line through the unit cell, and
wherein, in a test mode, data stored in the memory element is read out by performing a read operation while deactivating the word line.

2. The semiconductor memory device according to claim 1, wherein a leakage current is determined to have been generated if the data read out in the test mode is detected as logic 1.

3. The semiconductor memory device according to claim 1, wherein the memory element is non-volatile.

4. The semiconductor memory device according to claim 3, wherein the word line and the access signal are activated in response to a row address signal for the unit cell.

5. The semiconductor memory device according to claim 3, wherein the word line driving unit deactivates the word line and the access signal when the test signal is enabled.

6. The semiconductor memory device according to claim 3, wherein the word line driving controller includes:
an off signal generator configured to generate a word line off signal which is enabled in response to the output signal of the delay unit and disabled in response to the enable signal; and
a test mode inspection unit configured to transmit the word line off signal and the enable signal when the test signal is disabled, and disable the output signal of the word line driving controller when the test signal is enabled.

7. The semiconductor memory device according to claim 3, wherein the word line driving unit includes:
an input end configured to transmit a ground voltage or a high voltage in response to the output signal of the word line driving controller;
an inverter latch configured to temporarily store and invert a voltage transmitted by the input end, and output the access signal; and
a driving unit configured to invert the access signal, and drive the word line.

8. The semiconductor memory device according to claim 1, wherein the unit cell includes a variable resistor configured to have a resistance value change when the data is stored, and reads out the data based on a difference in an amount of current flow output by the variable resistor.

9. A phase change semiconductor memory device comprising:
a unit cell including a phase change memory element;
a word line coupled to a first end of the unit cell;
a bit line coupled to a second end of the unit cell;
a control signal generator configured to generate an enable signal for controlling execution or non-execution of a read operation in response to a read command from an external node;
a delay unit configured to delay the enable signal and output a delayed enabled signal; and
a word line driving controller configured to delay a timing point for deactivating the word line in response to the delayed enable signal, wherein, in a normal mode, a resistance status of the phase change memory element is read out as a current signal flowing from the bit line to the word line through the unit cell, and wherein, in a test mode, the resistance status of the phase change memory element is read out by performing a read operation while deactivating the word line.

10. The phase change semiconductor memory device according to claim 9, wherein, in the test mode, a leakage current is determined not to have occurred if the phase change memory element is in a high resistance state, and a leakage current is determined to have occurred if the phase change memory element is in a low resistance-state.

11. The phase change semiconductor memory device according to claim 9, wherein the phase change memory element is non-volatile.

12. The phase change semiconductor memory device according to claim 9, wherein the word line driving controller is configured to generate a word line off signal for controlling activation or deactivation of the word line in response to the delayed enable signal.

13. The phase change semiconductor memory device according to claim 12, wherein, if the word line off signal is enabled, the word line is deactivated.

14. The phase change semiconductor memory device according to claim 9, wherein the word line driving controller is configured to control execution or non-execution of a test operation in response to a test signal from an external part.

15. The phase change semiconductor memory device according to claim 14, wherein the word line driving controller is configured to deactivate the word line when the test signal is enabled.

16. The phase change semiconductor memory device according to claim 15, wherein the word line driving controller includes a test mode inspection unit configured to output disabled output signals when the test signal is enabled.

17. The phase change semiconductor memory device according to claim 15, wherein the word line driving controller is configured to perform a read operation according to an enable signal when the test signal is disabled.

18. The phase change semiconductor memory device according to claim 15, further comprising:

a sense-amplifier configured to measure a leakage current by performing a read operation when the word line is deactivated.

* * * * *